(12) United States Patent
Dubin et al.

(10) Patent No.: US 7,348,675 B2
(45) Date of Patent: Mar. 25, 2008

(54) MICROCIRCUIT FABRICATION AND INTERCONNECTION

(75) Inventors: Valery M. Dubin, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/048,231

(22) Filed: Feb. 1, 2005

(65) Prior Publication Data

US 2005/0167755 A1    Aug. 4, 2005

Related U.S. Application Data

(62) Division of application No. 10/336,236, filed on Jan. 2, 2003, now Pat. No. 6,933,222.

(51) Int. Cl.
*H01L 23/48* (2006.01)
*H01L 23/52* (2006.01)
*H01L 29/40* (2006.01)
*H01L 21/44* (2006.01)

(52) U.S. Cl. ............... 257/774; 257/758; 257/E23.145; 257/E51.04

(58) Field of Classification Search ................ 257/346, 257/377, 774, 327, 797, 900, 924, 29, 758, 257/211, E23.001, E23.141, E23.175, E23.145, 257/E23.151, E23.168, E21.627, E21.641, 257/E21.59, E51.04; 438/614, 617, 618
See application file for complete search history.

(56) References Cited

U.S. PATENT DOCUMENTS 6,159,742 A    12/2000   Lieber et al.
6,183,714 B1    2/2001   Smalley et al.
6,423,583 B1    7/2002   Avouris
6,486,489 B2    11/2002  Watanabe
6,515,339 B2    2/2003   Shin
6,590,231 B2    7/2003   Watanabe
6,645,455 B2    11/2003  Margrave et al.
6,652,055 B2    11/2003  Oikawa (Continued)

OTHER PUBLICATIONS

U.S. Appl. No. 10/864,751, filed Apr. 7, 2005, Bertin.

(Continued)

*Primary Examiner*—Hoai V Pham
*Assistant Examiner*—DiLinh Nguyen
(74) *Attorney, Agent, or Firm*—Schwabe, Williamson & Wyatt, P.C.

(57) ABSTRACT

Embodiments of methods in accordance with the present invention provide three-dimensional carbon nanotube (CNT) integrated circuits comprising layers of arrays of CNT's separated by dielectric layers with conductive traces formed within the dielectric layers to electrically interconnect individual CNT's. The methods to fabricate three-dimensional carbon nanotube FET integrated circuits include the selective deposition of carbon nanotubes onto catalysts selectively formed on a conductive layer at the bottom of openings in a dielectric layer. The openings in the dielectric layer are formed using suitable techniques, such as, but not limited to, dielectric etching, and the formation of ring gate electrodes, including spacers, that provide openings for depositing self-aligned carbon nanotube semiconductor channels.

7 Claims, 6 Drawing Sheets

U.S. PATENT DOCUMENTS

| | | |
|---|---|---|
| 6,652,923 B2 | 11/2003 | Uemura et al. |
| 6,683,783 B1 | 1/2004 | Smalley et al. |
| 6,689,674 B2 | 2/2004 | Zhang |
| 6,692,717 B1 | 2/2004 | Smalley et al. |
| 6,729,923 B2 * | 5/2004 | Ahn et al. .................... 445/24 |
| 6,740,910 B2 | 5/2004 | Roesner |
| 6,759,693 B2 | 7/2004 | Vogeli |
| 6,798,000 B2 | 9/2004 | Luyken |
| 6,821,911 B1 | 11/2004 | Lo |
| 6,852,582 B2 | 2/2005 | Wei |
| 6,855,603 B2 | 2/2005 | Choi |
| 6,891,227 B2 * | 5/2005 | Appenzeller et al. ....... 257/346 |
| 2002/0135026 A1 * | 9/2002 | Karasawa et al. .......... 257/377 |
| 2003/0168683 A1 * | 9/2003 | Farnworth et al. .......... 257/296 |

OTHER PUBLICATIONS

U.S. Appl. No. 10/763,092, filed Mar. 31, 2005, Dubrow.
U.S. Appl. No. 10/671,322, filed Mar. 24, 2005, Dubin.
U.S. Appl. No. 10/493,556, filed Mar. 17, 2005, Wada.
U.S. Appl. No. 10/917,932, filed Feb. 17, 2005, Bertin.
U.S. Appl. No. 10/827,813, filed Jan. 6, 2005, Yamamoto.
U.S. Appl. No. 10/745,251, filed Jul. 15, 2004, Liu.
U.S. Appl. No. 10/640,340, filed Jun. 10, 2004, Liu.
U.S. Appl. No. 10/628,239, filed Feb. 5, 2004, Moriya.
U.S. Appl. No. 10/335,857, filed Aug. 14, 2003, Yamaguchi.
U.S. Appl. No. 10/152,219, filed Jul. 3, 2003, Choi.
U.S. Appl. No. 10/292,552, filed Jun. 26, 2003, Ting.

* cited by examiner

MICROCIRCUIT FABRICATION AND INTERCONNECTION

CROSS-REFERENCES TO RELATED APPLICATIONS

This application is a divisional application of U.S. application Ser. No. 10/336,236 filed Jan. 2, 2003, now U.S. Pat. No. 6,933,222.

TECHNICAL FIELD

Embodiments of the present invention relate to microelectronic circuits and, more particularly, to microcircuit fabrication and interconnection of molecular electronic elements.

BACKGROUND

It is believed that in order to fabricate integrated circuits (IC) having feature sizes below 10 nm, a process other than the lithographic processes in current use for larger feature sizes will be required. This is due in part to wavelength limitations for resolving features of that scale. Molecular electronics shows promise as the technology capable of achieving IC feature sizes of 10 nm and below. One approach to fabricating molecular electronic devices is the use of carbon nanotubes (CNT).

Carbon nanotubes have a unique property wherein they can perform as a metal or as a semiconductor, depending on configuration. Small-scale integrated circuits can take advantage of carbon nanotube sub-10 nm size and the ability to take on p- or n-type semiconductor properties. Carbon nanotubes have unique properties compared with planar semiconductor devices, including: high chemical stability; high thermal conductivity; high mechanical strength; sizes below 10 nm; semiconductor- and metallic-like properties; the prospect to regulate band-gap by changing the diameter of the carbon nanotube; the prospect to make heterojunction devices; and the prospect of vertical integration providing high density IC's.

Carbon nanotubes differ substantially in operation from planar semiconductor devices. The carbon nanotube conducts essentially on its surface where all the chemical bonds are saturated and stable. Therefore, there is no need for careful passivation of the interface between the carbon nanotube channel and the gate dielectric. In other words, carbon nanotubes have no equivalent to the silicon/silicon dioxide interface of commonly used semiconductor devices.

One major impetus to achieving success with carbon nanotube technology is the difficulty in electrically interconnecting carbon nanotubes to fabricate integrated circuits. Single CMOS transistors have been demonstrated with carbon nanotubes placed to bridge the gap between two gold electrodes which were defined lithographically on 140 nm thick SiO2 film grown on a silicon wafer. However, this method utilizing single placement of a carbon nanotube will not prove commercially viable.

Another demonstrated method involved the fabrication of gold contacts interconnecting with an array of carbon nanotubes which were grown through templates of anodized aluminum with Co or Ni catalysts placed at the bottom of the pores of anodic aluminum oxide. However, this method cannot be used to make contact between single carbon nanotubes and therefore, the carbon nanotubes can not be integrated into integrated circuits.

In order for carbon nanotube technology to be a viable approach to fabricating nanometer-scale integrated circuit devices, for use in commercial products, methods for fabricating carbon nanotube integrated circuits scalable to commercial production must be developed.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of methods in accordance with the present invention provide three-dimensional carbon nanotube (CNT) integrated circuits comprising one or more layers of arrays of individual carbon nanotubes separated by dielectric layers. Conductive traces formed within the dielectric layers electrically interconnect individual carbon nanotubes.

FIGS. 1A-G are cross-sectional views of various stages of fabrication of integrated circuits comprising carbon nanotubes, in accordance with an embodiment of the methods of the present invention.

Figure 1A:
FIGS. 1A-G are cross-sectional views of various stages of fabrication of integrated circuits using carbon nanotubes, in accordance with an embodiment of the methods of the present invention.

FIG. 1A is a cross-sectional view of a base substrate 110, upon which the carbon nanotube integrated circuits are formed. In another embodiment in accordance with the present invention, the substrate comprises traditional CMOS and/or bi-polar devices.

Figure 1B:
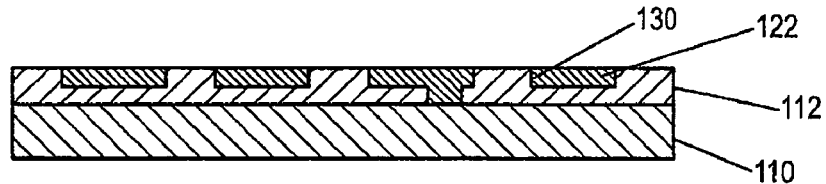
Figure 1C:
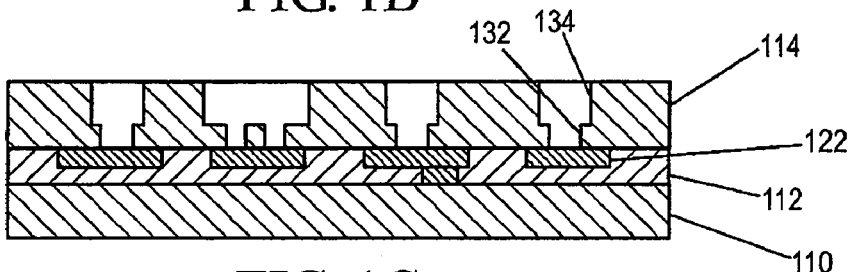

FIG. 1B is a cross-sectional view of a first dielectric layer 112 on the base substrate 110. The first dielectric layer 112 comprises one or more dielectric layers. The first dielectric layer 112 comprises a first conductive layer 122 within a plurality of first vias 130 forming electrodes. FIG. 1C is a cross-sectional view of a second dielectric layer 114 provided on the first dielectric layer 112 and covering the first conductive layer 122. The second dielectric layer 114 is patterned with a plurality of second vias 132 extending to and at least partially exposing the first conductive layer 122. The second vias 132, in other embodiments, have diameters of less than 50 nm. The second dielectric layer 114 is further patterned with a plurality of third vias 134. The plurality of third vias 134 in other embodiments have diameters of up to 100 nm. The third vias 134 are in communication with one or more second vias 132.

Figure 1D:
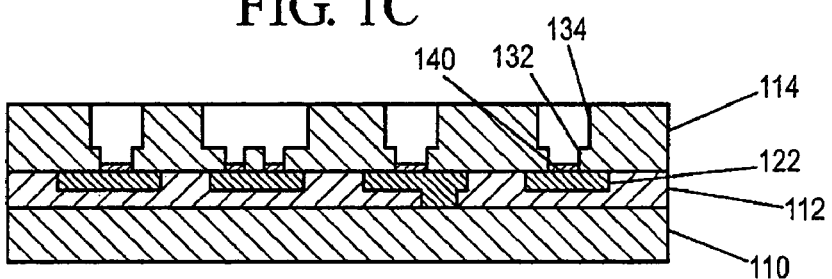

FIG. 1D is a cross-sectional view of a catalyst layer 140 on the first conductive layer 122 at the bottom of the second vias 132. The catalyst layer 140 comprises suitable material upon which the carbon nanotube is to be deposited. Suitable catalyst layer 140 material includes, but is not limited to Co, Ni, and Fe, and combinations thereof.

Figure 1E:
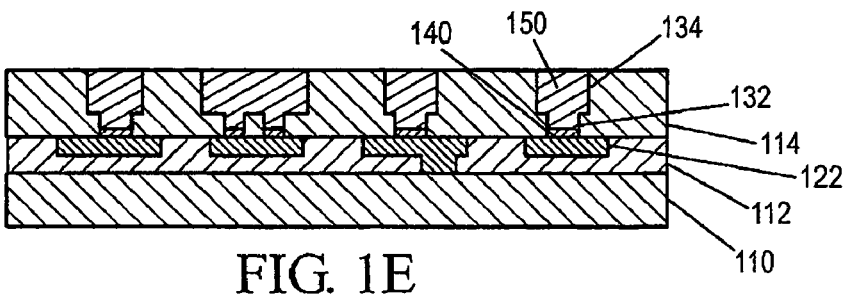

FIG. 1E is a cross-sectional view of second and third vias 132,134 wherein carbon nanotube 150 has been deposited or grown. The carbon nanotube 150 takes the form of the different diameter vias 132, 134, the significance of which is described below.

Figure 1F:
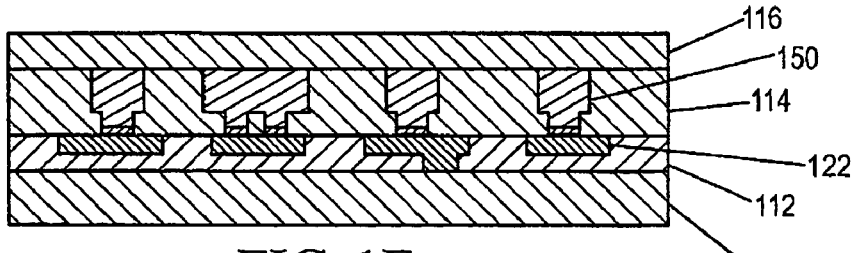

FIG. 1F is a cross-sectional view of a third dielectric layer 116 covering the second dielectric layer 114 and the carbon nanotubes 150.

Figure 1G:
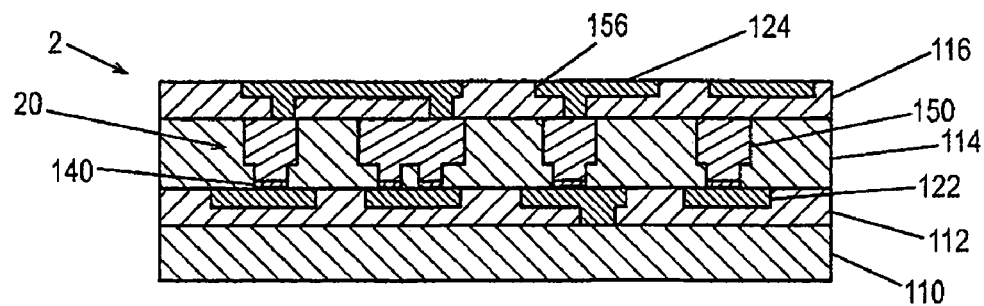

FIG. 1G is a cross-sectional view of the third dielectric layer 116 patterned with a plurality of fourth vias 156, some of which extending to and exposing the carbon nanotubes 150. The fourth vias 156 are provided with a second conductive layer 124 using, for example, but not limited thereto, single or dual damascene techniques or reactive ion etching. The conductive layer 124 completes the electrical circuit comprising the carbon nanotube 150.

Wherein no more circuit layers are desired, the conductive layer 124 is provided with a passivation layer (not shown). Wherein more circuit layers are desired, the above method is repeated with the addition of a first dielectric layer 112 on the conductive layer 122, to achieve the desired plurality of circuit layers. The passivation layer is the final layer provided on the substrate 2 prior to packaging. The resulting integrated circuit substrate 2, containing carbon nanotube integrated circuits 20, is packaged into a microelectronic package (not shown) using standard techniques.

Figure 2A:
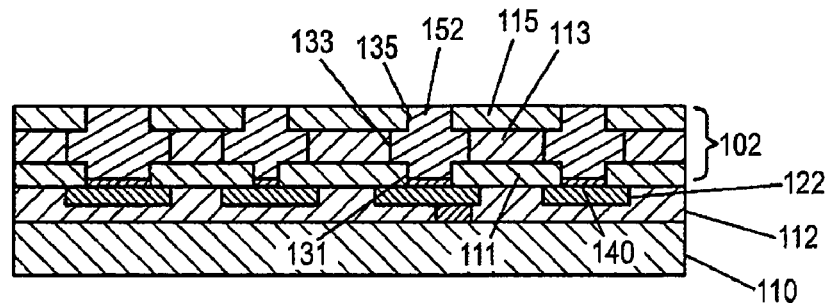
FIGS. 2A-B are cross-sectional views of two stages of fabrication of carbon nanotube integrated circuits using carbon nanotubes, in accordance with an embodiment of the methods of the present invention.
Figure 2B:
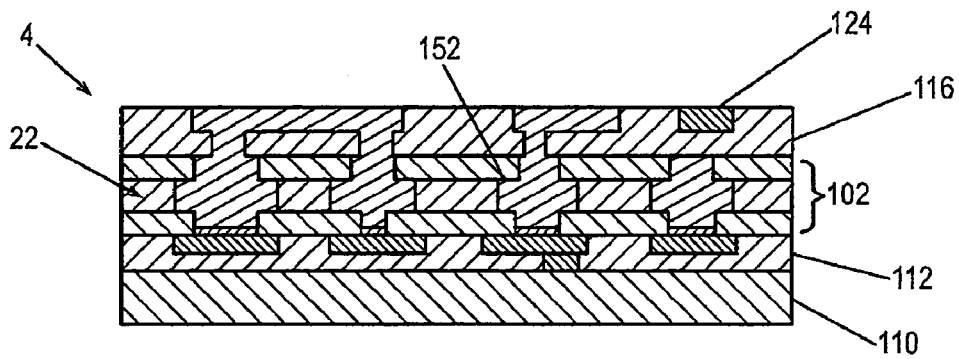

FIGS. 2A-B are cross-sectional views of two stages of fabrication of carbon nanotube integrated circuits 22, in accordance with an embodiment of the method of the present invention.

FIG. 2A is a cross-sectional view of three layers of interlayer dielectric 111,113,115, each interlayer sequentially deposited and provided with vias 131,133,135. A catalyst layer 140 is provided on the conductive layer 122, from which the carbon nanotubes 152 are grown. Each carbon nanotube 152 is grown within the multi-diameter space formed by the vias 131,133,135 using a deposition process, the carbon nanotubes 152 taking the form of the multi-diameter space.

FIG. 2B is a cross-sectional view of the embodiment of FIG. 2A provided with a fifth dielectric layer 116 and a second conductive layer 124, which provides electrical interconnects to exterior components. Wherein more circuit layers are desired, the above method steps are repeated, beginning with the addition of a first dielectric layer 112 on the second conductive layer 124, to achieve the desired plurality of circuit layers. A passivation layer is the final layer provided on the substrate 4 prior to packaging. The resulting integrated circuit substrate 4, containing carbon nanotube integrated circuits 22, is packaged into a microelectronic package (not shown) using standard techniques.

Figure 3:
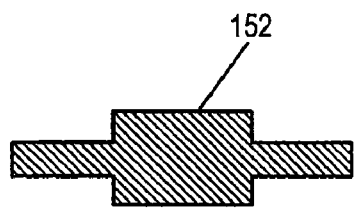
FIG. 3 is a cross-sectional view of a carbon nanotube integrated circuit device, in accordance with an embodiment of the methods of the present invention.

FIG. 3 is a cross-sectional view of one carbon nanotube 152 that is formed using the method of FIG. 2A. It is known that the band-gap, Eg, of a semiconducting carbon nanotube depends strongly on its diameter, d. The methods of fabricating carbon nanotube 152, in accordance with embodiments of the present invention, provide the ability to vary the diameter of the carbon manometer over its length. The changing diameters of the carbon nanotube 152 corresponds inversely to that of a simple band-gap structure, wherein Eg is inversely proportional to d.

In other embodiments, in accordance with methods of the present invention, three-dimensional carbon nanotube integrated circuit features are provided as multiple layers of carbon nanotube arrays, such as, but is not limited to, heterojunction devices, separated by dielectric layers where interconnects are formed to connect the carbon nanotubes.

The catalyst from which the carbon nanotubes are grown/deposited is provided on the conductive layer exposed at the base of the dielectric vias using any number of suitable processes. Suitable processes, include, but are not limited to, chemical deposition and electroless plating. Suitable catalyst material includes, but is not limited to, Ni, Co, and Fe, and combinations thereof.

The carbon nanotube provides an integrated circuit with the following desirable properties: high thermal conductivity; high mechanical strength, having a Young's modulus of over 1 Tera Pascal and estimated tensile strength of 200 Gpa; high chemical stability wherein all chemical bonds are saturated; the capability to carry a very high current density of up to 1 e9 A/cm2; and high device densities through three-dimensional vertical integration.

The embodiments in accordance with the methods of the present invention are characterized by the following features: the ability to provide three-dimensional integration allowing for increased device densities; the use of single or dual damascene patterning techniques to fabricate a template in the dielectric material for growing the carbon nanotubes and formation of interconnects; the formation of heterojunction devices, such as, but not limited to diodes, simply by changing the diameter of the carbon nanotubes; and selective deposition of catalysts by using processes such as, but not limited to, electroless plating, followed by selective deposition of vertically oriented carbon nanotubes.

Figure 4:
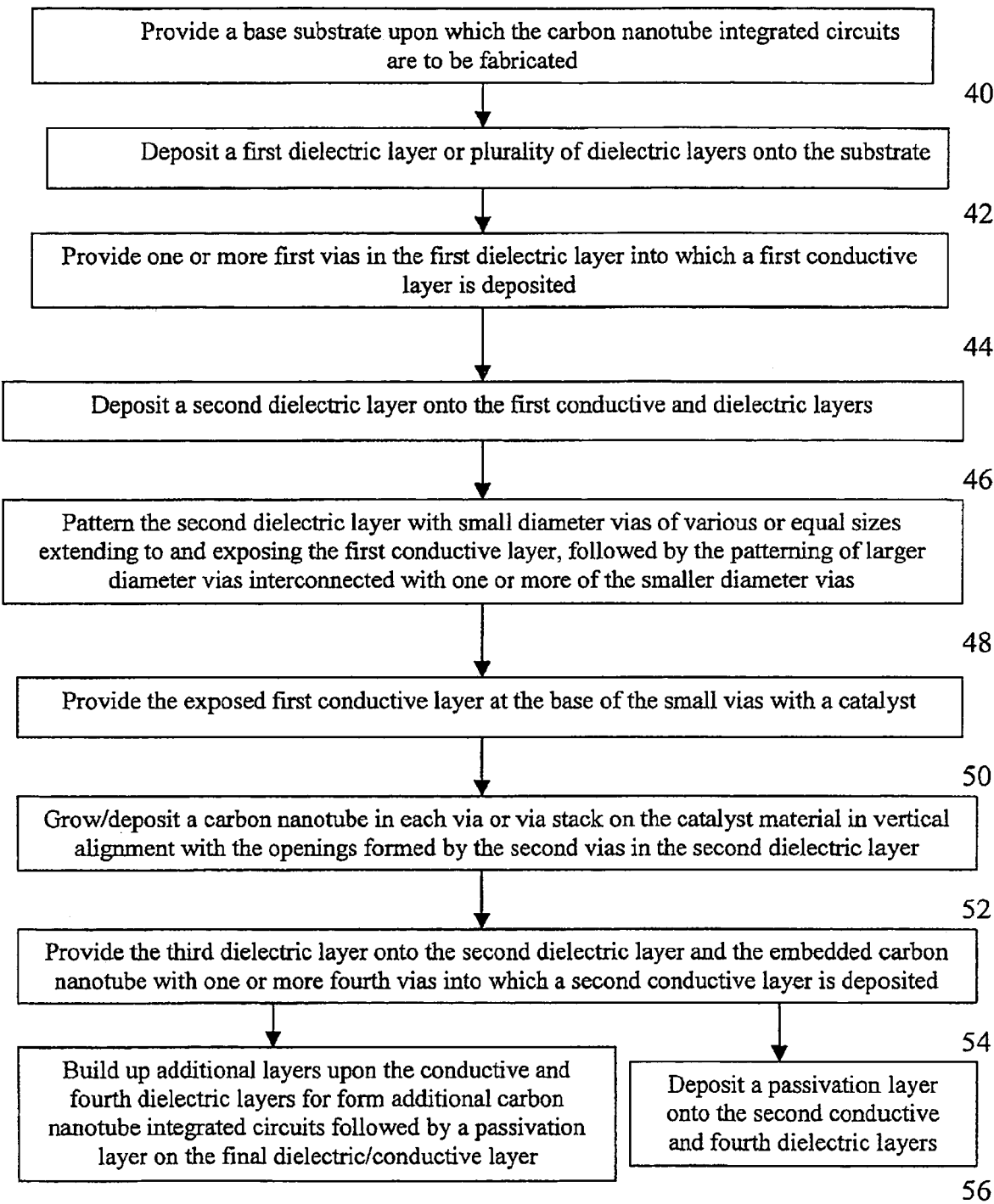
FIG. 4 is a flow diagram of methods for fabricating carbon nanotube integrated circuits, in accordance with embodiments of the present invention.

FIG. 4 is a flow diagram of a method for fabricating carbon nanotube integrated circuits, in accordance with an embodiment of the present invention. A base substrate is provided upon which the carbon nanotube integrated circuits are to be fabricated 40. In an embodiment, the base substrate comprises traditional CMOS and/or bi-polar devices.

A first dielectric layer, or plurality of dielectric layers, is deposited onto the substrate 42. The dielectric layer comprises a suitable material for the particular purpose, including, but not limited to, SiO2, SiON, SiN, SiC, Al2O3, Si, and CN, high k dielectric HfO2, ZrO2 and low k dielectric such as CDO and nanoglass. A combination of dielectric materials can be deposited to form different diameter carbon nanotube segments. By way of example, one carbon nanotube can contain two segments of differing diameters, or contain three segments having two or more different diameters. In one embodiment, band-gap is controlled by the arrangement of differing diameters of the carbon nanotube.

One or more first vias are provided in the first dielectric layer into which a first conductive layer is deposited 44. Vias are formed using known processes, including the dual damascene patterning techniques.

The conductive layer comprises a suitable material for the particular purpose, including, but not limited to, single or dual damascene copper interconnects, poly-silicon interconnects, salicides, and refractory metal interconnects such as, but not limited to, Ta, Ru, W, Nb, Zr, Hf, Ir, La, Ni, Co, Au, Pt, Rh, Mo, and their combinations.

A second dielectric layer is deposited onto the first conductive and first dielectric layers 46. The second dielectric layer is patterned with small diameter vias of various or equal sizes extending to and exposing the first conductive layer. Larger diameter vias are provided and interconnected with one or more of the smaller diameter vias 48.

The exposed first conductive layer at the bottom of the small vias is provided with a catalyst material 50. Selective deposition of catalyst is provided by, for example, but is not limited to, using electroless plating with activation in Pd-containing solution. Catalyst materials include, but are not limited to, Co, Ni, Rh—Pt, Ni—Y, and Fe, and their combinations.

Carbon nanotubes are grown from or deposited on the catalyst material in vertical alignment with the openings formed by the second vias in the second dielectric layer 52. In one embodiment, an electrical field is applied during carbon nanotube growth to provide vertical orientation. The carbon nanotubes are deposited or grown from the catalyst material using known techniques. Suitable techniques include, but are not limited to, electrical discharge between carbon electrodes, laser vaporization of carbon, thermal decomposition of hydrocarbons such as acetylene, methane, ethane, and gas phase chemical vapor deposition (CVD) using CO and metal carbonyls.

Carbon nanotubes can be fabricated having more than one terminal tube of various diameters defined by the vias provided in the second dielectric layer. The various carbon nanotube diameters provide the ability to regulate the band-gap width and to form heterojunction devices.

In an embodiment in accordance with the present invention, the second dielectric layer and the embedded carbon nanotube are planarized using suitable techniques. An example of a planarization technique includes, but is not limited to, chemical-mechanical planarization (CMP).

A third dielectric layer is provided onto the second dielectric layer and the embedded carbon nanotubes with one or more fourth vias into which a second conductive layer is deposited 54. The second conductive layer is provided using a suitable process, including, but not limited to, dual damascene patterning techniques, and electroless plating of conductive material such as, but not limited to, Co, Ni, Pd, Ag, Rh, and Au. Another suitable process includes the formation of Co and Ni salicides formed in openings of poly-silicon by deposition of Co or Ni followed by anneal and selective etch.

A passivation layer is deposited onto the second conductive and fourth dielectric layers 56. In another embodiment, additional layers are built up upon the conductive and fourth dielectric layers to form additional carbon nanotube integrated circuits followed by a passivation layer on the final dielectric/conductive layer 58.

Other methods, in accordance with embodiments of the present invention, provide for the fabrication of field effect transistors (FET), including CMOS, using integrated circuits comprising carbon nanotubes. The field effect transistors comprise: layers of vertical transistors comprised of carbon nanotube semiconductors; poly-silicon, salicide and/or metal source/drain and gate electrodes; silicon oxide and/or high k gate dielectrics separated by one or more layers of interconnects made from poly-silicon, salicides or refractory metals, providing three-dimensional vertically integrated circuits.

The methods to fabricate three-dimensional carbon nanotube FET integrated circuits include the selective deposition of carbon nanotubes onto catalysts selectively formed on a conductive layer at the bottom of openings in a dielectric layer. The openings in the dielectric layer are formed using suitable techniques, such as, but not limited to, dielectric etching, and the formation of ring gate electrodes, including spacers, that provide openings for depositing self-aligned carbon nanotube semiconductor channels.

Two or more layers of carbon nanotube semiconductor FET transistors are separated from each other by a dielectric layer. Electrical communication between individual FET transistors is provided by forming conductive interconnects there between. Conductive is provided using a suitable process, such as, but not limited to, damascene conductive and reactive ionization etching.

Figure 5A:
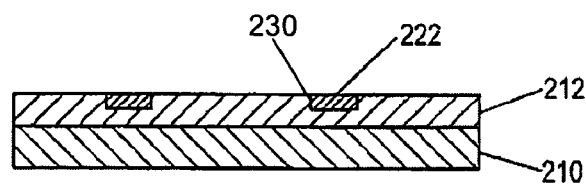
FIGS. 5A-5F are cross-sectional views of various stages of fabrication of field effect transistors (FET), including CMOS, as three-dimensional integrated circuits using self-aligned carbon nanotube channels inside ring gate electrodes, in accordance with an embodiment of the methods of the present invention.

FIGS. 5A-F are cross-sectional views of various stages of the fabrication of field effect transistors, as three-dimensional integrated circuits, using self-aligned carbon nanotube channels inside ring gate electrodes, also known as Donald's-shape gates, in accordance with an embodiment of the methods of the present invention. FIG. 5A is a cross-sectional view of a base substrate 210 provided with a first dielectric layer 212. A first conductive layer is provided within the first vias 230, which form drain (source) electrodes 222.

Figure 5B:
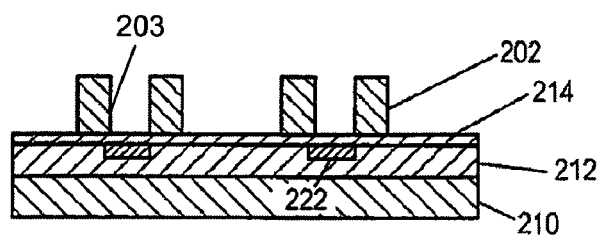

FIG. 5B is a cross-sectional view of a second dielectric layer 214 covering the first dielectric layer 212 and drain (source) electrodes 222. Ring gate electrodes 202 are provided on the second dielectric layer 214, the axis of the bore of the ring gate electrode centered upon the drain (source) electrode 222. The ring gate electrodes 202 are provided, in one embodiment, by deposition and etching of ring gate electrode material, using known techniques.

Figure 5C:
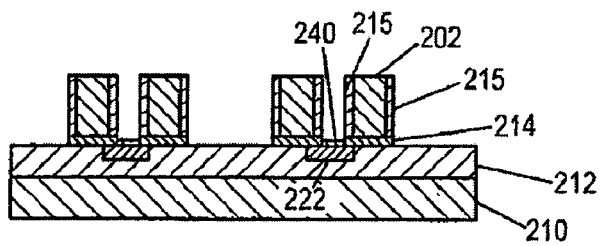

FIG. 5C is a cross-sectional view of the second dielectric layer 214 having exposed surfaces etched away to the first dielectric layer 212 and drain (source) electrodes 222. The second dielectric layer 214 remains under the ring gate electrodes 202. A dielectric layer or spacers (gate dielectric) 215 are formed on the inner and outer surfaces of the ring gate electrodes 202, the bore, in an embodiment, having a diameter of no more than 50 nm. Catalyst material 240 is deposited on the drain (source) electrodes 222 in the bore 203 of the ring gate electrodes 202.

Figure 5D:
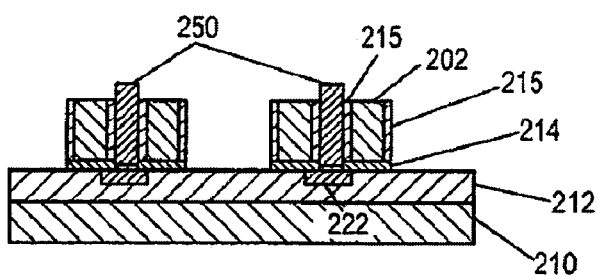
Figure 5E:
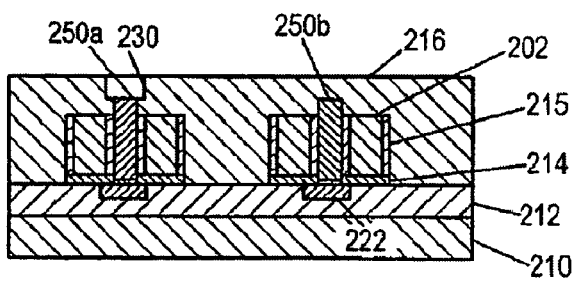

FIG. 5D is a cross-sectional view of p-type (n-type) carbon nanotubes 250 grown/deposited from the catalyst material 240 in vertical alignment with the inner surface of the bores 203 and extending beyond the ring gate electrodes 202. FIG. 5E is a cross-sectional view of a third dielectric layer 216 deposited on the first dielectric layer 212, the ring gate electrodes 202, and the carbon nanotubes 250. A first via 230 is provided in the third dielectric layer 216 exposing one of two adjacent carbon nanotubes 250A, 250B.

The exposed carbon nanotube 250A is converted from a p-type (n-type) to an n-type (p-type) carbon nanotube 250A by vacuum annealing or doping of the carbon nanotube 250A. Doping of carbon nanotubes 250A can be done by using alkali metals, such as, but not limited to, Li, Na, K, Cs, and using mono-metallofullerene encapsulating lanthanide elements, such as, but not limited to, Ce, Nd, Gd, Dy, or by partial chemical functionalization using, for example, F, and/or substitutional doping using, for example, B and N, on the sidewalls of carbon nanotube 250A.

Figure 5F:
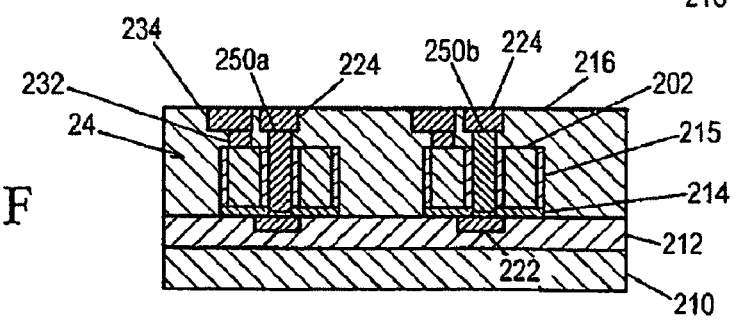

FIG. 5F is a cross-sectional view of a second conductive layer forming electrical contacts 224 in second and third vias 232,234 to provide electrical interconnection with the ring gate electrodes 202, the carbon nanotubes 250A, 250B, and source (drain) electrodes. The process is repeated, if desired, to provide vertically integrated FET devices 24.

FIGS. 6A-F are cross-sectional views of various stages of the fabrication of three-dimensional integrated circuits using carbon nanotube semiconductor channels deposited into openings formed by etching the dielectric layer, in accordance with another embodiment of the method of the present invention.

Figure 6A:
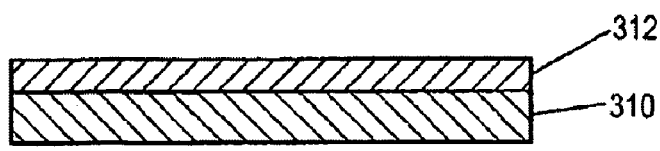
FIGS. 6A-F are cross-sectional views of various stages of fabrication of three-dimensional integrated circuits using carbon nanotube channels deposited into openings formed by etching the dielectric layer, in accordance with an embodiment of the methods of the present invention.

FIG. 6A is a cross-sectional view of a base substrate 310 provided with a first dielectric layer 312. The base substrate 310, in another embodiment, comprises traditional CMOS or bi-polar devices.

Figure 6B:
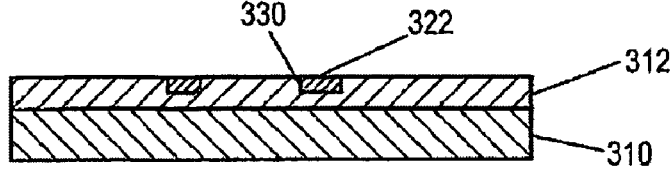

FIG. 6B is a cross-sectional view of a first conductive layer forming drain (source) electrodes 322 within first vias 330. The material for the drain (source) electrodes 322 includes, for example, but is not limited to, poly-Si, salicides, and metals.

Figure 6C:
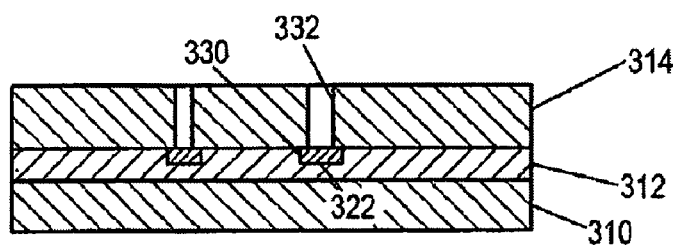

FIG. 6C is a cross-sectional view of a second dielectric layer 314 deposited onto the first dielectric layer 312 and drain (source) electrodes 322, and patterned using an etching process, forming second vias 332 for growing carbon nanotube semiconductor channels. In an embodiment, second vias 332 are formed having diameters of no more than 50 nm. The material for the second dielectric layer 312 includes, but is not limited to, high k dielectric $HfO_2$, $ZrO_2$ and $SiO_2$, among others.

Figure 6D:
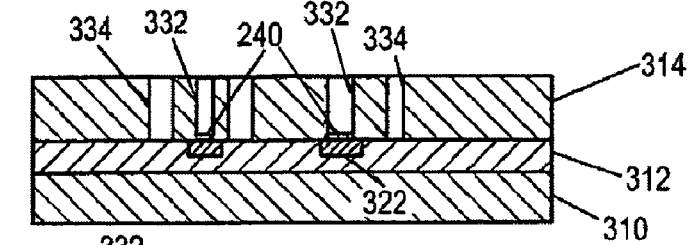

FIG. 6D is a cross-sectional view of the second dielectric layer 314 patterned with third vias 334 for forming ring gate electrodes. Selective deposition of catalyst 240 is deposited on the drain (source) electrodes 322 at the bottom of the second vias 332. In other embodiments, other gate electrode shapes are provided.

Figure 6E:
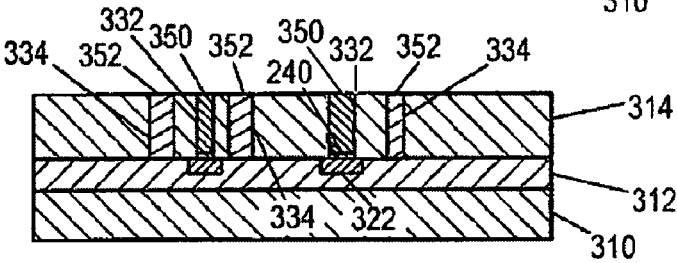

FIG. 6E is a cross-sectional view of selective deposition of carbon nanotube 350 on the catalysts 240 to form p-type carbon nanotube semiconductors. Selected p-type carbon nanotubes are converted to n-type carbon nanotubes by vacuum anneal or doping.

For CMOS devices, p-type carbon nanotube is deposited in those vias wherein n-type carbon nanotubes are desired. The p-type carbon nanotubes are converted into n-type by annealing. Following the conversion, p-type carbon nanotube is deposited into the vias wherein p-type is desired.

Ring gate electrodes 352 are formed in the third vias 334. In another embodiment, poly-Si is used for the gates 202, and doping is used to establish desired properties.

Figure 6F:
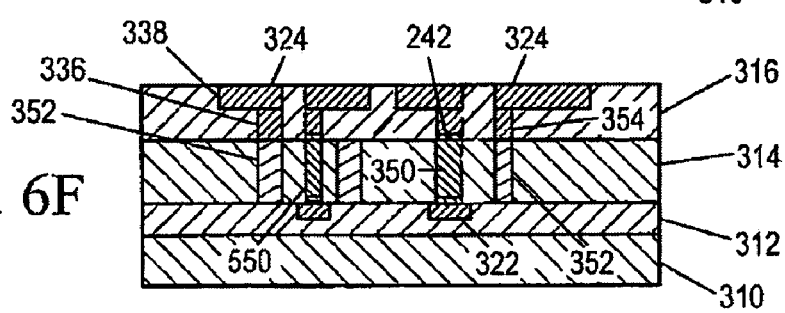

FIG. 6F is a cross-sectional view of a third dielectric layer 316, such as, but not limited to, $SiO_2$, deposited on the second dielectric layer 314, the carbon nanotubes 350 and the gate electrodes 352. Fourth and fifth vias 336, 338 are provided in the third dielectric layer 316 to expose the ring gate electrodes 352 and the carbon nanotubes 350. The forth and fifth vias 336, 338 are provided with a second conductive layer to form local interconnects 324.

In another embodiment in accordance with the invention, carbide-forming metals, such as, but not limited to Co, Ni, and Fe, and combinations thereof, are selectively deposited on the gate electrodes 352. Metal carbides are formed, for example, during an annealing process.

Figure 8:
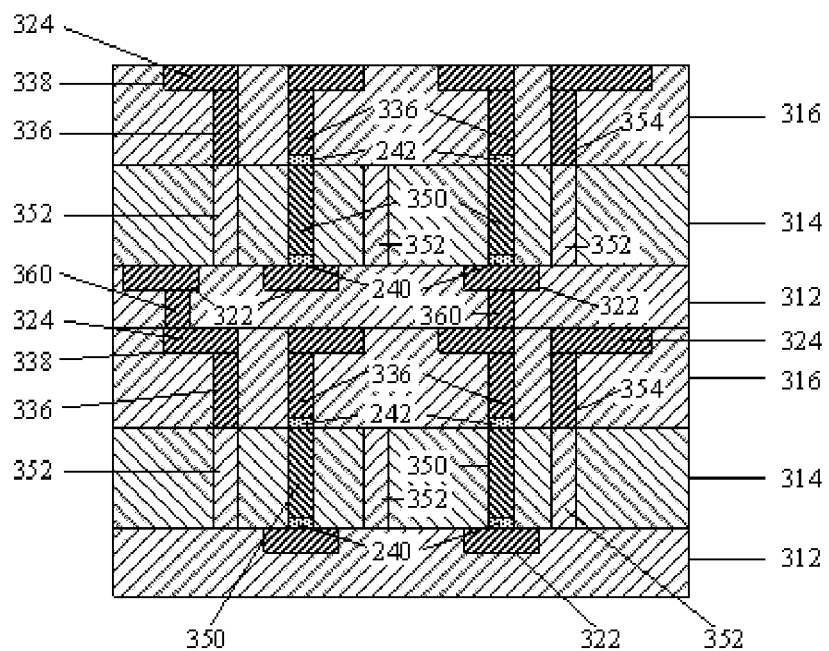
FIG. 8 is a cross-sectional view of a three-dimensional integrated circuit using carbon nanotube channels, in accordance with an embodiment of the present invention.
Figure 9:
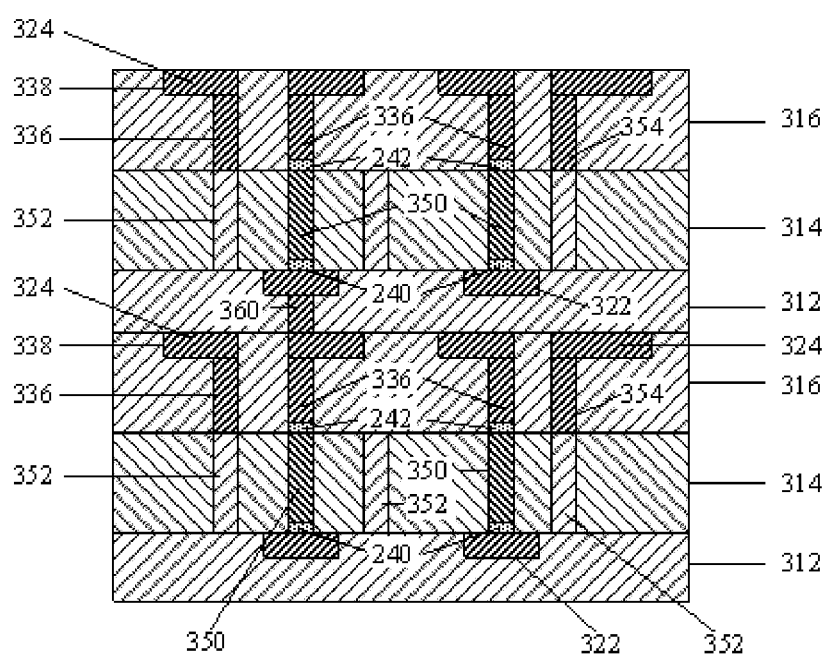
FIG. 9 is a cross-sectional view of a three-dimensional integrated circuit using carbon nanotube channels, in accordance with an embodiment of the present invention.

As noted previously, CNT integrated circuits of various embodiments may comprise one or more layers of arrays of individual carbon nanotubes separated by dielectric layers, with conductive traces formed within the dielectric layers electrically interconnecting individual carbon nanotubes. FIG. 8 and FIG. 9 illustrate cross-sectional views of embodiments of three-dimensional integrated circuits. FIG. 8 illustrates an embodiment wherein the first through third dielectric layers 312, 314, 316 define one integrated circuit transistor substrate and wherein the integrated circuit further comprises one or more additional integrated circuit transistor substrates disposed thereon. In these embodiments, one or more second conductive pads 324 of one integrated circuit transistor substrate are in electrical communication with one or more first conductive pads 322 of an adjacent series-connected integrated circuit transistor substrate. Conductive traces 360 may be formed within the dielectric layers for electrically interconnection.

FIG. 9 illustrates a cross-sectional view of another embodiment of a three-dimensional integrated circuit. FIG. 9 illustrates an embodiment wherein the first through third dielectric layers 312, 314, 316 define one integrated circuit transistor substrate and wherein the integrated circuit further comprises one or more additional integrated circuit transistor substrates disposed thereon. In these embodiments, one or more second conductive pads 324 of one integrated circuit transistor substrate are in electrical communication with one or more first conductive pads 322 of an adjacent series-connected integrated circuit transistor substrate, the carbon nanotubes 350 of one integrated circuit transistor substrate are in series connection with only carbon nanotubes 350 of an adjacent integrated circuit transistor substrate. Conductive traces 360 may be formed within the dielectric layers to electrically interconnect individual carbon nanotubes 350.

Figure 7A:
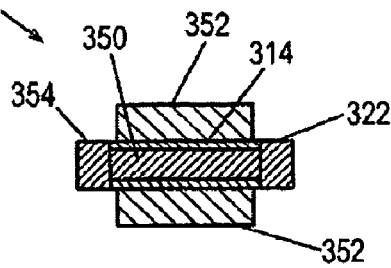
FIGS. 7A and 7B shows side and end cross-sectional views, respectively, of a carbon nanotubes field-effect transistor, in accordance with an embodiment of the present invention.
Figure 7B:
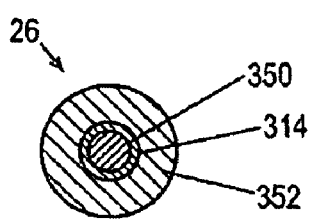

FIGS. 7A and 7B are side and end cross-sectional views, respectively, of an embodiment of a carbon nanotube field-effect transistor 26 provided in accordance with embodiments of the methods of the present invention. The carbon nanotube field-effect transistor 26 comprises a source 322, a drain 354, a gate 352 and the carbon nanotube semiconductor channel 350, the gate 352 electrically insulated from the nanotube semiconductor channel 350 by a second dielectric layer 314.

The conductance of carbon nanotubes (the source-drain current) decreases strongly with increasing gate voltage, which not only demonstrates that the carbon nanotube device operates as a field-effect transistor but also that transport through the semiconducting carbon nanotube is dominated by positive carriers (holes). The conductance modulation of carbon nanotube FET can exceed 5 orders of magnitude.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An integrated circuit comprising:
  a first dielectric layer;
  a first via of the first dielectric layer;
  a first conductive pad disposed on the first dielectric layer or in the first via of the first dielectric layer;
  a second dielectric layer having a thickness and defining a second via and a third via, the second and third vias extending through the thickness of the second dielectric layer, the second via in communication with the first conductive pad, and the third via disposed coaxially to the first via and electrically insulated from the first conductive pad;
  a carbon nanotube semiconductor material disposed in the second via and through the thickness of the second dielectric layer, and correspondingly in communication with the first conductive pad;
  a conductive material disposed in the third via and through the thickness of the second dielectric layer, the conductive material electrically insulated from the carbon nanotube semiconductor material to form a ring gate electrode; and
  a third dielectric layer disposed over the second dielectric layer and including a second conductive pad in communication with a selected one of the carbon nanotube semiconductor material in the second via and the conductive material.

2. The integrated circuit of claim 1, further comprising:
  a first substrate upon which the first dielectric layer is disposed.

3. The integrated circuit of claim 1, further comprising:
  a passivation layer disposed on the third dielectric layer and second conductive pads.

4. The integrated circuit of claim 1, wherein the first, the second, and the third dielectric layers define one integrated circuit transistor substrate, the integrated circuit further comprising:
  one or more additional integrated circuit transistor substrates disposed thereon, wherein the second conductive pad of the one integrated circuit transistor substrate are in electrical communication with a first conductive pad of an adjacent series-connected integrated circuit transistor substrate of the one or more additional integrated circuit transistor substrates, providing that the carbon nanotube semiconductor material of one integrated circuit transistor substrate is in series connection with only a carbon nanotube semiconductor material of an adjacent integrated circuit transistor substrate.

5. The integrated circuit of claim 1, wherein the carbon nanotube semiconductor material comprises a selected one of a p-type material converted from an n-type material and an n-type material converted from a p-type material, and wherein the integrated circuit further comprises another carbon nanotube semiconductor material disposed in another via in the second dielectric material and comprising the non-selected one of the p-type material converted from the n-type material and the n-type material converted from the p-type material.

6. The integrated circuit of claim 1, wherein the first, the second, and the third dielectric layers define one integrated circuit transistor substrate, the integrated circuit further comprising:
  one or more additional integrated circuit transistor substrates disposed thereon, wherein the second conductive pad of the one integrated circuit transistor substrate are in electrical communication with the first conductive pad of an adjacent series-connected integrated circuit transistor substrate of the one or more additional integrated circuit transistor substrates.

7. The integrated circuit of claim 6, wherein the first conductive pad forms a selected one of a source and a drain, and the second conductive pad forms the non-selected one of the source and the drain.

* * * * *